United States Patent
Satoh et al.

(10) Patent No.: US 10,516,391 B2
(45) Date of Patent: Dec. 24, 2019

(54) APPARATUSES AND METHODS FOR DATA TRANSMISSION OFFSET VALUES IN BURST TRANSMISSIONS

(71) Applicant: Micron Technology, Inc., Boise, ID (US)

(72) Inventors: Yasuo Satoh, Tsukuba (JP); Kazutaka Miyano, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/839,531

(22) Filed: Dec. 12, 2017

(65) Prior Publication Data
US 2019/0181847 A1   Jun. 13, 2019

(51) Int. Cl.
| | |
|---|---|
| *H03K 3/017* | (2006.01) |
| *H03K 5/156* | (2006.01) |
| *G11C 7/22* | (2006.01) |
| *H03L 7/081* | (2006.01) |
| *G11C 7/12* | (2006.01) |
| *G11C 11/4076* | (2006.01) |
| *G11C 7/10* | (2006.01) |

(52) U.S. Cl.
CPC .......... *H03K 5/1565* (2013.01); *G11C 7/12* (2013.01); *G11C 7/222* (2013.01); *G11C 11/4076* (2013.01); *H03L 7/0812* (2013.01); *G11C 7/1018* (2013.01); *H03K 3/017* (2013.01)

(58) Field of Classification Search
CPC ........ H03K 5/1565; H03K 3/017; G11C 7/12; G11C 7/222; G11C 7/1018; H03L 7/0812

USPC ......................................................... 327/175
See application file for complete search history.

(56) References Cited

U.S. PATENT DOCUMENTS

| | | | |
|---|---|---|---|
| 6,477,107 B1 | 11/2002 | Lee | |
| 7,417,479 B2 | 8/2008 | Kitayama | |
| 7,633,324 B2 * | 12/2009 | Yun | H03K 5/1565 327/160 |
| 7,863,957 B2 * | 1/2011 | Jang | H03K 5/151 327/158 |
| 7,961,017 B2 * | 6/2011 | Lee | H03L 7/0814 327/149 |
| 8,207,772 B2 * | 6/2012 | Shin | G11C 7/22 327/172 |
| 8,581,650 B2 * | 11/2013 | Kim | H03L 7/089 327/156 |
| 2007/0086267 A1 | 4/2007 | Kwak | |

(Continued)

OTHER PUBLICATIONS

International Search Report and Written Opinion dated Mar. 21, 2019 for PCT Application No. PCT/US2018/063673, 10 pages.

*Primary Examiner* — Dinh T Le
(74) *Attorney, Agent, or Firm* — Dorsey & Whitney LLP

(57) ABSTRACT

Apparatuses and methods for data transmission offset values in burst transmissions. An example apparatus may include offset logic configured to provide offset values associated with a receiver circuit of a memory device coupled to a signal line. The offset values are based on individual transition threshold voltages biases of sample circuits of the receiver circuit. The example apparatus may further include an input/output (I/O) circuit comprising a driver circuit. The driver circuit configured to receive a logic signal and the offset values and to provide an output signal to the signal line based on the logic signal and to adjust voltages of the output signal based on the offset values.

15 Claims, 9 Drawing Sheets

(56) References Cited

U.S. PATENT DOCUMENTS

2009/0167384 A1 7/2009 Sohn et al.
2016/0156342 A1 6/2016 Yun et al.
2017/0040986 A1 2/2017 Ma

* cited by examiner

APPARATUSES AND METHODS FOR DATA TRANSMISSION OFFSET VALUES IN BURST TRANSMISSIONS

BACKGROUND

Current and future generation DRAM and SDRAM applications utilize very high I/O speeds. As a result, the clock speeds are also very high. The high clock speeds may make aligning phases and setting duty cycles of clocks challenging, as timing windows and margin for error are both very narrow. The narrow margins may result in reduced reliability when correcting phase differences or detecting a duty cycle error, which may cause data to be unreliably communicated between a host and a memory.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
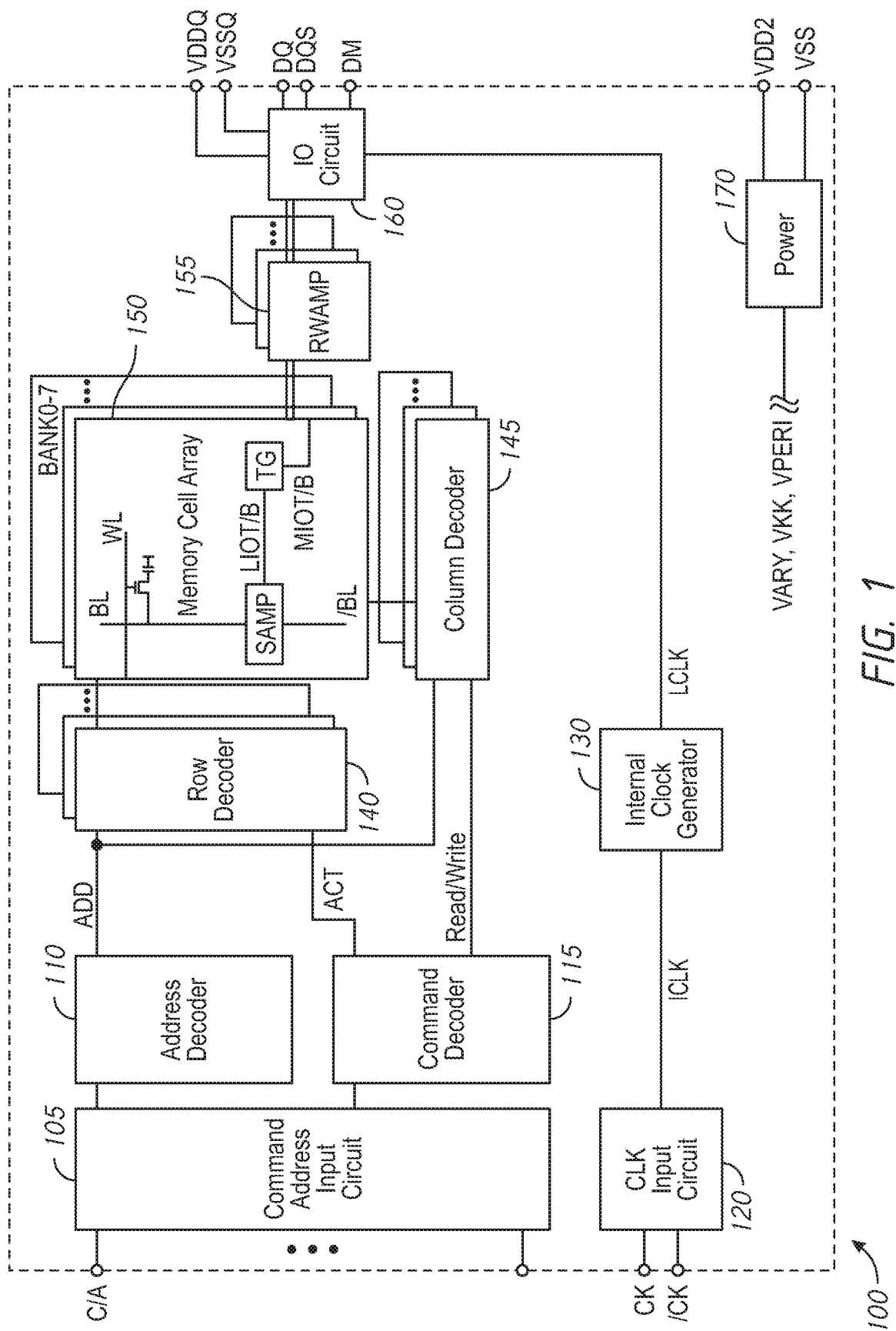
FIG. 1 illustrates a schematic block diagram of a semiconductor device according to an embodiment of the disclosure.

FIG. 1 illustrates a schematic block diagram of a semiconductor device 100 in accordance with an embodiment of the present disclosure. The semiconductor device 100 includes a memory die. The memory die may include a command/address input circuit 105, an address decoder 110, a command decoder 115, a clock input circuit 120, internal clock generator 130, row decoder 140, column decoder 145, memory arrays 150, read/write amplifiers 155, I/O circuit 160, and power circuit 170.

In some embodiments, the semiconductor device 100 may include, without limitation, a dynamic random-access memory (DRAM) device, such as double data rate (DDR) DDR4, DDR5, low power(LP) DDR, integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 100 may employ a plurality of external terminals that include address and command terminals coupled to command/address bus (C/A), clock terminals CK and /CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the command/address input circuit 105, to an address decoder 110. The address decoder 110 receives the address signal and decodes the address signal to provide decoded address signal ADD. The ADD signal includes a decoded row address signal and a decoded column address signal. The decoded row address signal is provided to the row decoder 140, and a decoded column address signal is provided to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory array 150 designated by these row address and column address. The read data DQ is output to outside from the data terminals DQ (data), DQS (data strobe), and DM (data mask) via read/write amplifiers 155 and an input/output circuit 160. Similarly, when the write command is issued and a row address and a column address are timely supplied with this command, and then write data is supplied to the data terminals DQ, DQS, DM, the write data is received by data receivers in the input/output circuit 160, and supplied via the input/output circuit 160 and the read/write amplifiers 155 to the memory array 150 and written in the memory cell designated by the row address and the column address.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a clock input circuit 105. The clock input circuit 105 may receive the external clock signals to generate an internal clock signal ICLK. The internal clock signal ICLK is supplied to an internal clock generator 130 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 130. The phase controlled internal clock signal LCLK is supplied to the input/output circuit 160 and is used as a timing signal for determining an output timing of read data. In some examples, the clock generator 130 includes a duty cycle correction (DCC) circuit configured to correct a duty cycle of the LCLK signal. The DCC may include circuitry to create multiple divided clocks with shifted phases, and to generate integrated clocks from the multiple divided clocks. The integrated clocks may be used to determine a duty cycle error, which may be used to apply a correction to the LCLK signal.

The power supply terminals are supplied with power supply potentials VDD and VSS. These power supply potentials VDD2 and VSS are supplied to an internal voltage generator circuit 170. The internal voltage generator circuit 170 generates various internal potentials VKK, VARY, VPERI, and the like based on the power supply potentials VDD2 and VSS. The internal potential VKK is mainly used in the row decoder 140, the internal potential VARY are mainly used in the sense amplifiers included in the memory array 150, and the internal potential VPERI is used in many other circuit blocks.

The power supply terminals are also supplied with power supply potentials VDDQ and VSSQ. These power supply potentials VDDQ and VSSQ are supplied to the input/output circuit 160. The power supply potentials VDDQ and VSSQ are typically the same potentials as the power supply potentials VDD2 and VSS, respectively. However, the dedicated power supply potentials VDDQ and VSSQ are used for the input/output circuit 160 so that power supply noise generated by the input/output circuit 160 does not propagate to the other circuit blocks.

Figure 2:
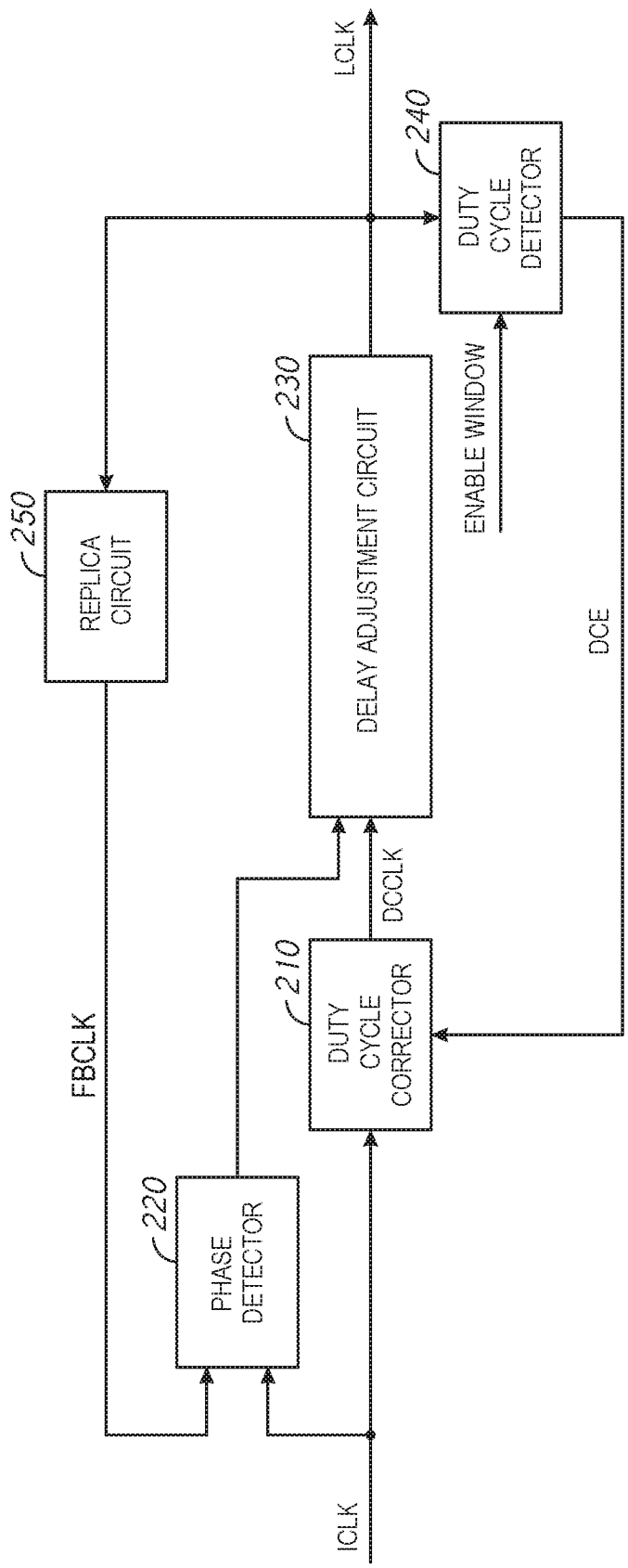
FIG. 2 illustrates a schematic block diagram of a delay-locked loop (DLL) and a duty cycle correction (DCC) circuit in accordance with an embodiment of the disclosure.

FIG. 2 illustrates a schematic block diagram of a delay-locked loop (DLL) and a duty cycle correction (DCC) circuit DLL/DCC 200 in accordance with an embodiment of the disclosure. The DLL/DCC circuit 200 includes a duty cycle corrector 210, a phase detector 220, a delay adjustment circuit 230, a duty cycle detector 240, and a replica circuit 250. The internal clock generator 130 of FIG. 1 may implement the DLL/DCC circuit 200.

The duty cycle corrector 210 may receive the internal clock signal ICLK and a duty cycle error signal DCE from the 240, and may adjust a duty cycle of the ICLK signal to provide a duty corrected clock signal DCCLK.

The phase detector 220 may receive an internal clock signal ICLK and a feedback clock signal from the replica circuit 250, and may determine a phase difference between the FBCLK signal and the ICLK signal. The phase detector 220 may provide a phase adjustment signal to the delay adjustment circuit 230 to adjust a phase of duty cycle adjusted clock signal DCCLK based on the determined phase difference. The phase correction signal may be set to a value to adjust a delay of the delay adjustment circuit 230 to align the phases of the FBCLK and ICLK signals. The delay adjustment circuit 230 may receive the DCCLK signal and may provide the LCLK signal at an output that has a phase adjustment controlled by the phase adjustment signal from the phase detector 220. In some examples, the delay adjustment circuit 230 includes components that are switched in or out to adjust a propagation delay through the delay adjustment circuit 230 based on the phase adjustment signal.

The duty cycle detector 240 may receive the LCLK signal and may detect a duty cycle error (DCE) and provide a DCE signal to the duty cycle corrector 210. In some examples, the duty cycle detector 240 may include a clock divider to provide divided clock signals (e.g., clock signals having a longer clock cycle or period as compared with the LCLK signal) based on the LCLK signal, and may use the divided clock signals (e.g., clock signals having a longer clock cycle or period as compared with the LCLK signal) to determine the DCE. The duty cycle detector 240 may perform determine the DCE during a duty cycle detection operation. The duty cycle detection operation may be controlled by the enable window signals ENABLE WINDOW received at the duty cycle detector 240. That is, the duty cycle detection operation may be set for a specific time period, and the ENABLE WINDOW signals indicate when the specific time period is active. In some examples, the duty cycle detection operation may be set for 6, 8, 10, or more clock cycles of the LCLK signal. The ENABLE WINDOW signals may be received from a control circuit within the DLL/DCC circuit 200, or from another circuit within an internal clock generator or on a semiconductor device.

The replica circuit 250 may receive the LCLK signal and delays the LCKLK signal to provide a feedback clock signal FBCLK to the phase detector 220. The propagation delay of the replica circuit 250 may model delays of downstream circuitry to which the LCLK is distributed, such as clock trees, signal line delays, input/output (I/O) circuitry delays, etc.

In operation, DLL/DCC circuit 200 is configured to modify a phase and duty cycle of the ICLK signal to provide the LCLK signal such that the phase and duty cycle of the LCLK signal allows successful communication with connected devices. The phase detector 220, the replica circuit 250, and the delay adjustment circuit 230 may be used to adjust the phase of the ICLK signal, and the duty cycle corrector 210 and the duty cycle detector 240 may adjust a duty cycle of the ICLK signal to provide the DCCLK signal.

The phase detector 220 may determine a phase difference between the FBCLK signal received from the replica circuit 250 and the ICLK signal, and may provide control signals to the delay adjustment circuit 230 to adjust a phase of the LCLK signal based on the determined phase difference. The phase correction signal provided by the phase detector 220 may be based on the phase difference, and may be set to a value to adjust a delay of the replica circuit 250 to align the phases of the FBCLK and ICLK signals. The propagation delay of the replica circuit 250 may model delays of downstream circuitry to which the LCLK is distributed.

The duty cycle corrector 210 may adjust a duty cycle of the ICLK signal based on the DCE signal to provide the DCCLK signal to the delay adjustment circuit 230. The duty cycle detector 240 may analyze the LCLK to determine the duty cycle error and set the DCE signal based on the detected duty cycle error. In some examples, the duty cycle detector 240 may include a shift register that is shifted forward or backward to set a value on the DCE signal. In some examples, the duty cycle detector 240 may only set/adjust the DCE signal during specific time periods (e.g., during a duty cycle detection operation), such as after a power up. The duty cycle detector 240 may receive enable window signals ENABLE WINDOW to control the duty cycle detection operation. In some examples, the duty cycle detector 240 may include a clock divider to generate divided clock signals from the LCLK signal, and the duty cycle error may be determined based on the divided clock signals. Using divided clock signals to detect a duty cycle error may increase a detection margin as compared with using clock signals with a period equal to a period of the LCLK signal directly.

Figure 3:
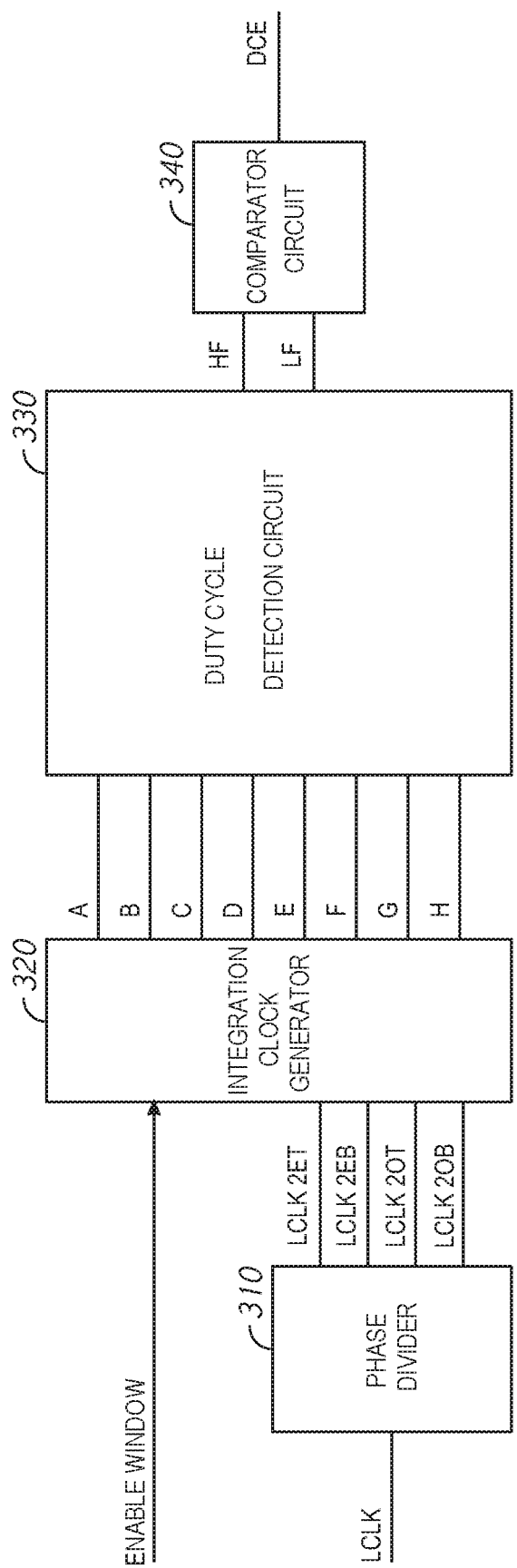
FIG. 3 illustrates a duty cycle detector in accordance with an embodiment of the disclosure.

FIG. 3 illustrates a duty cycle detector 300 in accordance with an embodiment of the disclosure. The duty cycle detector 300 may include a phase divider 310, an integration clock generator 320, a duty cycle detection circuit 330, and a comparison circuit 340 to detect a duty cycle error of the LCLK signal. The internal clock generator 130 of FIG. 1 and/or the duty cycle detector 240 of FIG. 2 may include the duty cycle detector 300, in some examples.

The phase divider 310 receives the local clock signal LCLK, and provides divided clock signals LCLK2ET, LCLK2EB, LCLK2OT, and LCLK2OB. The LCLK2ET, LCLK2EB, LCLK2OT, and LCLK2OB signals may double the period of the LCLK signal, but other divided clock signal multipliers may be used. The LCLK2ET, LCLK2EB, LCLK2OT, and LCLK2OB signals may include phase offsets from each other. For example, the LCLK2ET signal may be offset from the LCLK2EB signal by 180 degrees, offset from the LCLK2OT by 90 degrees, and offset from the LCLK2OB signal by 270 degrees. The LCLK2EB signal may be offset from the LCLK2OT signal by −90 degrees and offset from the LCLK2OB by 90 degrees. The LCLK2OT signal may be offset from the LCLK2OB signal by 180 degrees.

The integration clock generator 320 generates integration clock signals A-H based on the LCLK2ET, LCLK2EB, LCLK2OT, and LCLK2OB signals while the enable window signals ENABLE WINDOW are set. The A-H integration clock signals may have a same period as the LCLK2ET, LCLK2EB, LCLK2OT, and LCLK2OB signals. Each of the A-H integration clock signals may have timing based on a respective one of the LCLK2ET, LCLK2EB, LCLK2OT, and LCLK2OB signals. The ENABLE WINDOW signals may be set for a defined time period, such as 6 LCLK clock cycles, in some examples.

The duty cycle detection circuit 330 may set a high duty cycle signal HF and a low duty cycle signal LF based on the A-H integration clock signals. The duty cycle detection circuit 330 may include pull-up and pull-down circuits controlled by the A-H integration clock signals. In an example, the pull-up circuits may be controlled by the A-D integration clock signals and the pull-down circuits may be controlled by the E-H integration clocks signals. The comparison circuit 340 compares the HF and LF signal lines to determine a duty cycle.

In operation, the duty cycle detector 300 uses the LCLK2ET, LCLK2EB, LCLK2OT, and LCLK2OB signals to determine a duty cycle error. By using the LCLK2ET, LCLK2EB, LCLK2OT, and LCLK2OB signals, the detection margin is increased, allowing for more accurate and reliable detection of the duty cycle error. The phase divider 310 provides the LCLK2ET, LCLK2EB, LCLK2OT, and LCLK2OB signals with phase shifts relative to one another. In the example where the LCLK2ET, LCLK2EB, LCLK2OT, and LCLK2OB signals are double the period of the LCLK signal, the LCLK2ET, LCLK2EB, LCLK2OT, and LCLK2OB signals are phased shifted by 90 degrees relative to another of the LCLK2ET, LCLK2EB, LCLK2OT, and LCLK2OB signals.

While the ENABLE WINDOW signals are set (e.g., during the duty cycle detection window), the integration clock generator 320 generates the integration clock signals A-H based on the LCLK2ET, LCLK2EB, LCLK2OT, and LCLK2OB signals. The duty cycle detection window may occur during initialization, such as part of a power up operation. The integration clock signals A-H control pull-up and pull-down circuitry of the duty cycle detection circuit 330. Each of the A-H integration clock signals may have timing based on a respective one of the LCLK2ET, LCLK2EB, LCLK2OT, and LCLK2OB signals. The ENABLE WINDOW signals may be set for a defined time period, such as 6 LCLK clock cycles, in some examples.

The duty cycle detection circuit 330 may set the HF and LF signals based on the A-H integration clock signals. The comparison circuit 340 may compare the HF and LF signals to determine a duty cycle error by determining a ratio the HF signal is high to a ratio the LF signal is high. If the ratio is 50%/50%, then the duty cycle error is zero. Any other ratio value indicates a non-zero duty cycle error. The comparison circuit 340 may set the DCE signal to a value indicating the duty cycle error.

Figure 4A:
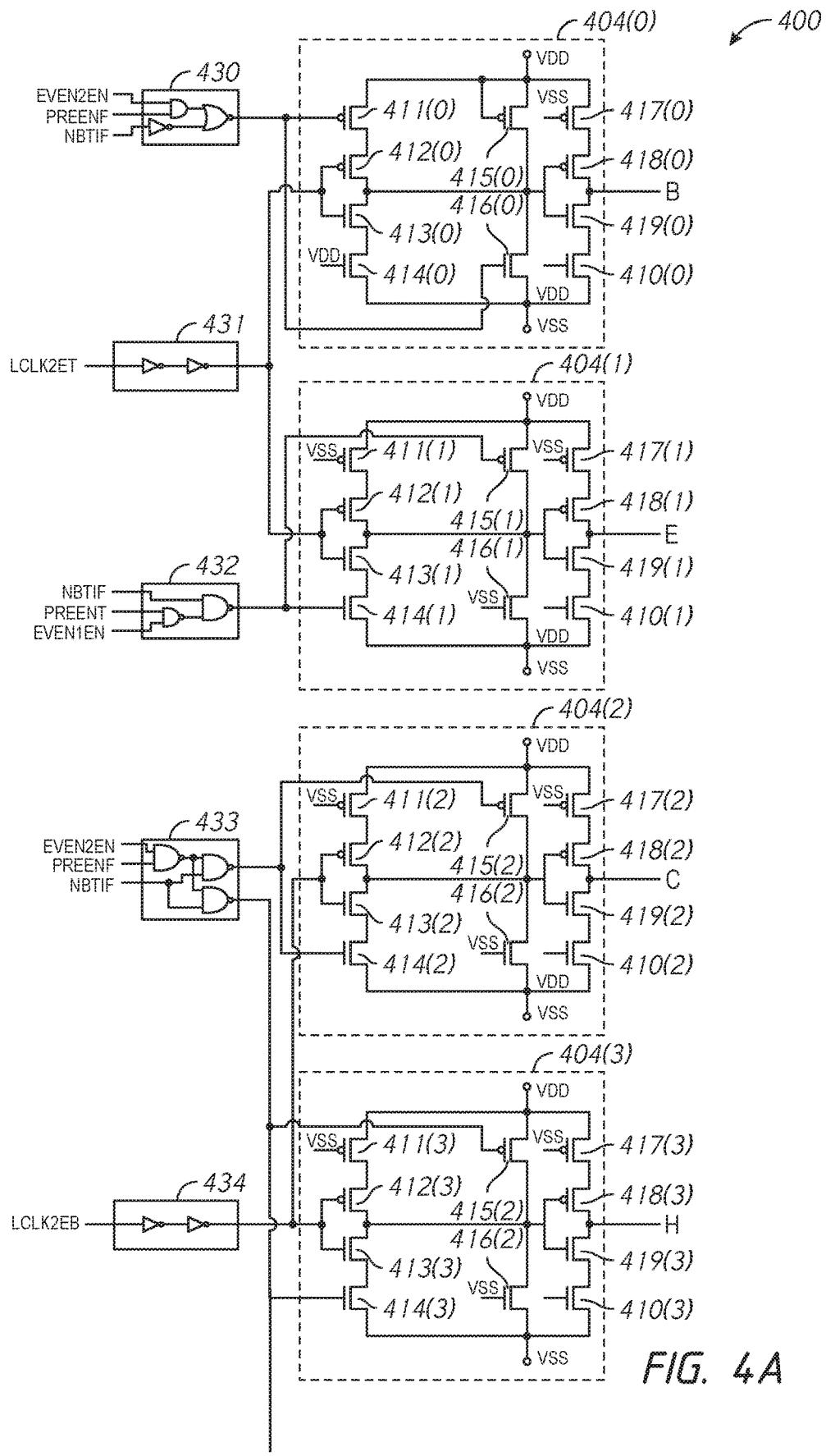
FIGS. 4A and 4B together illustrate an integration clock generator circuit in accordance with an embodiment of the disclosure.
Figure 4B:
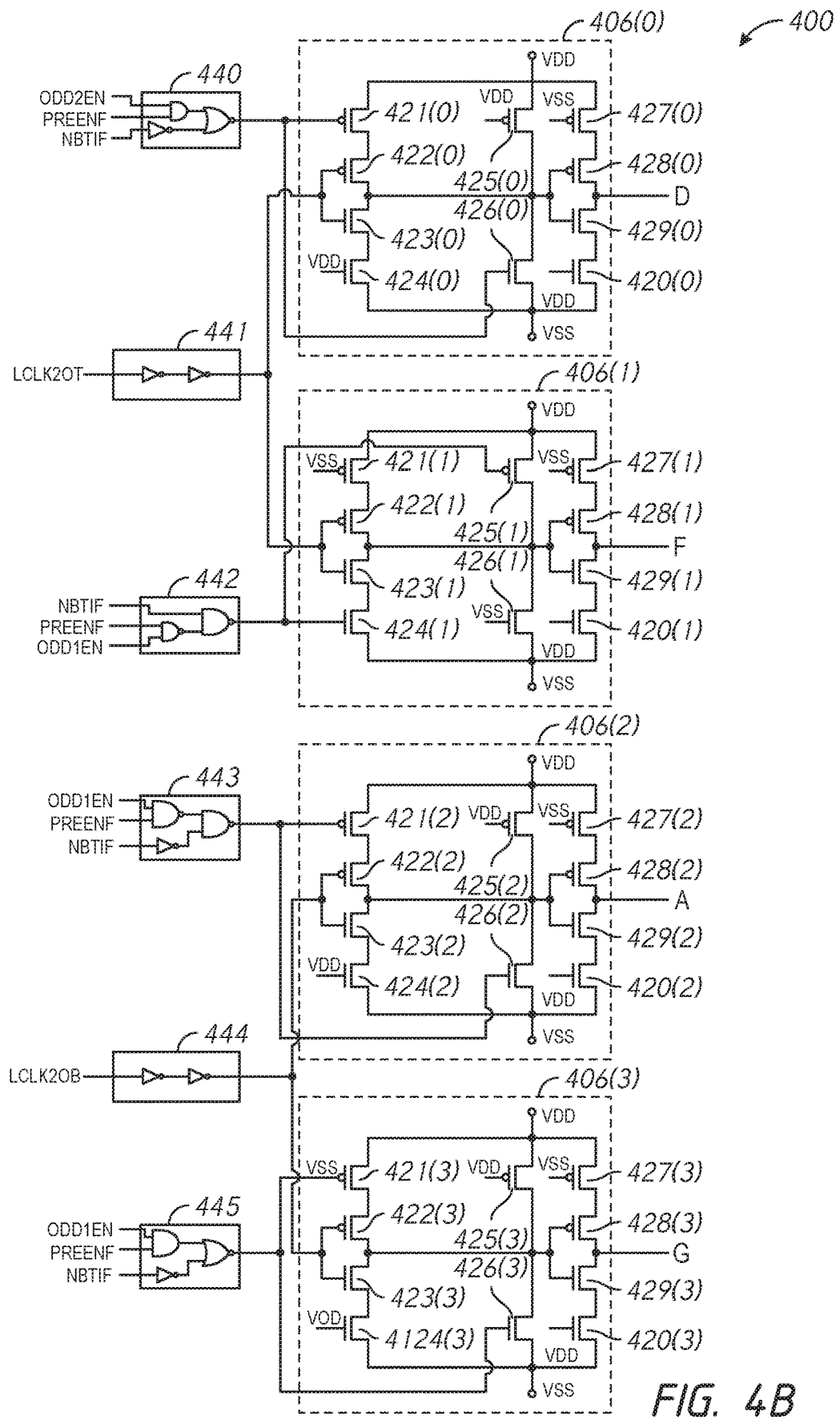

FIGS. 4A and 4B together illustrate an integration clock generator circuit 400 in accordance with an embodiment of the disclosure. The integration clock generator circuit 400 may include even clock signal generators 404(0)-(3) of FIG. 4A and odd signal clock generators 406(0)-(3) of 4B to provide the A-H integration clock signals. The internal clock generator 130 of FIG. 1, the duty cycle detector 240 of FIG. 2, and/or the integration clock generator 320 of FIG. 3 may include the integration clock generator circuit 400 of FIGS. 4A and 4B, in some examples.

Turning to FIG. 4A, the even clock signal generators 404(0)-(3) may generate the B, C, E, and H integration clock signals based on the LCLK2ET and LCLK2EB signals and the enable window signals EVENIEN and EVEN2EN. The even clock signal generators 404(0)-(3) each include respective transistors 411(0)-(3), 412(0)-(3), 413(0)-(3), 414(0)-(3), 415(0)-(3), 416(0)-(3), 417(0)-(3), 418(0)-(3), 419(0)-(3), 410(0)-(3). The transistors 411(0)-(3), 412(0)-(3), 413(0)-(3), 414(0)-(3) are coupled in series to form an inverter. The transistors 415(0)-(3), 416(0)-(3) are coupled in series, with a node between the transistors 415(0)-(3), 416(0)-(3) coupled to an output of the inverter formed by the transistors 411(0)-(3), 412(0)-(3), 413(0)-(3), 414(0)-(3). The transistors 417(0)-(3), 418(0)-(3), 419(0)-(3), 410(0)-(3) are coupled in series to form an inverter with an input coupled to an output of the inverter formed by the transistors 411(0)-(3), 412(0)-(3), 413(0)-(3), 414(0)-(3) and an output to provide the respective B, C, E, or H integration clock signal. The logic circuit 431 may provide the LCLK2ET signal to the even clock signal generators 404(0)-(1). The logic circuit 434 may provide the LCLK2EB signal to the even clock signal generators 404(2)-(3). The logic circuits 431 and 434 may adjust a drive strength of the LCLK2ET and LCLK2EB signals to drive circuitry of the even clock signal generators 404(0)-(3).

The logic circuit 430 may provide an enable signal to the even clock signal generator 404(0) based on the EVEN2EN signal, in addition to a precharge mask signal PREENF and a negative-bias temperature instability toggle enable signal NBTIF. The enable signal provided by the logic circuit 430 controls when the B integration clock signal is provided by the even clock signal generator 404(0).

The logic circuit 432 may provide an enable signal to the even clock signal generator 404(1) based on the EVENIEN signal, in addition to the PREENF signal and the NBTIF signal. The enable signal provided by the logic circuit 432 controls when the E integration clock signal is provided by the even clock signal generator 404(1).

The logic circuit 433 may provide an enable signal to the even clock signal generators 404(2)-(3) based on the EVEN2EN signal, in addition to the PREENF signal and the NBTIF signal. The enable signal provided by the logic circuit 433 controls when the C and H integration clock signals are provided by the even clock signal generators 404(2)-(3), respectively.

Turning to FIG. 4B, the odd clock signal generators 406(0)-(3) may generate the A, D, F, and G integration clock signals based on the LCLK2OT and LCLK2OB clock and the enable window signals ODD1EN and ODD2EN. The odd clock signal generators 406(0)-(3) each include respective transistors 421(0)-(3), 422(0)-(3), 423(0)-(3), 424(0)-(3), 425(0)-(3), 426(0)-(3), 427(0)-(3), 428(0)-(3), 429(0)-(3), 420(0)-(3). The transistors 421(0)-(3), 422(0)-(3), 423(0)-(3), 424(0)-(3) are coupled in series to form an inverter. The transistors 425(0)-(3), 426(0)-(3) are coupled in series, with a node between the transistors 425(0)-(3), 426(0)-(3) coupled to an output of the inverter formed by the transistors 421(0)-(3), 422(0)-(3), 423(0)-(3), 424(0)-(3). The transistors 427(0)-(3), 428(0)-(3), 429(0)-(3), 420(0)-(3) are coupled in series to form an inverter with an input coupled to an output of the inverter formed by the transistors 421(0)-(3), 422(0)-(3), 423(0)-(3), 424(0)-(3) and an output to provide the respective A, D, F, or G integration clock signal. The logic circuit 441 may provide the LCLK2OT signal to the odd clock signal generators 406(0)-(1). The logic circuit 444 may provide the LCLK2OB signal to the odd clock signal generators 406(2)-(3). The logic circuits 441 and 444 may adjust a drive strength of the LCLK2OT and LCLK2OB signals to drive circuitry of the odd clock signal generators 406(0)-(3).

The logic circuit 440 may provide an enable signal to the odd clock signal generator 406(0) based on the ODD2EN signal, in addition to the PREENF signal and the NBTIF signal. The enable signal provided by the logic circuit 440 controls when the D integration clock signal is provided by the odd clock signal generator 406(0).

The logic circuit 442 may provide an enable signal to the odd clock signal generator 406(1) based on the ODDIEN signal, in addition to the PREENF signal and the NBTIF signal. The enable signal provided by the logic circuit 442 controls when the F integration clock signal is provided by the odd clock signal generator 406(1).

The logic circuit 443 may provide an enable signal to the odd clock signal generator 406(2) based on the ODDIEN signal, in addition to the PREENF signal and the NBTIF signal. The enable signal provided by the logic circuit 443 controls when the A integration clock signal is provided by the odd clock signal generator 406(2).

The logic circuit 445 may provide an enable signal to the odd clock signal generator 406(3) based on the ODDIEN signal, in addition to the PREENF signal and the NBTIF signal. The enable signal provided by the logic circuit 445 controls when the G integration clock signal is provided by the odd clock signal generator 406(3).

Exemplary relative timing of the LCLK clock signal; the LCLK2ET, LCLK2EB, LCLK2OT, and LCLK2OB signals; the EVEN1EN, EVEN2EN, ODDIEN, and ODD2EN enable window signals; and the A-H integration clock signals may be described further with reference to the timing diagram of FIG. 6.

Figure 5:
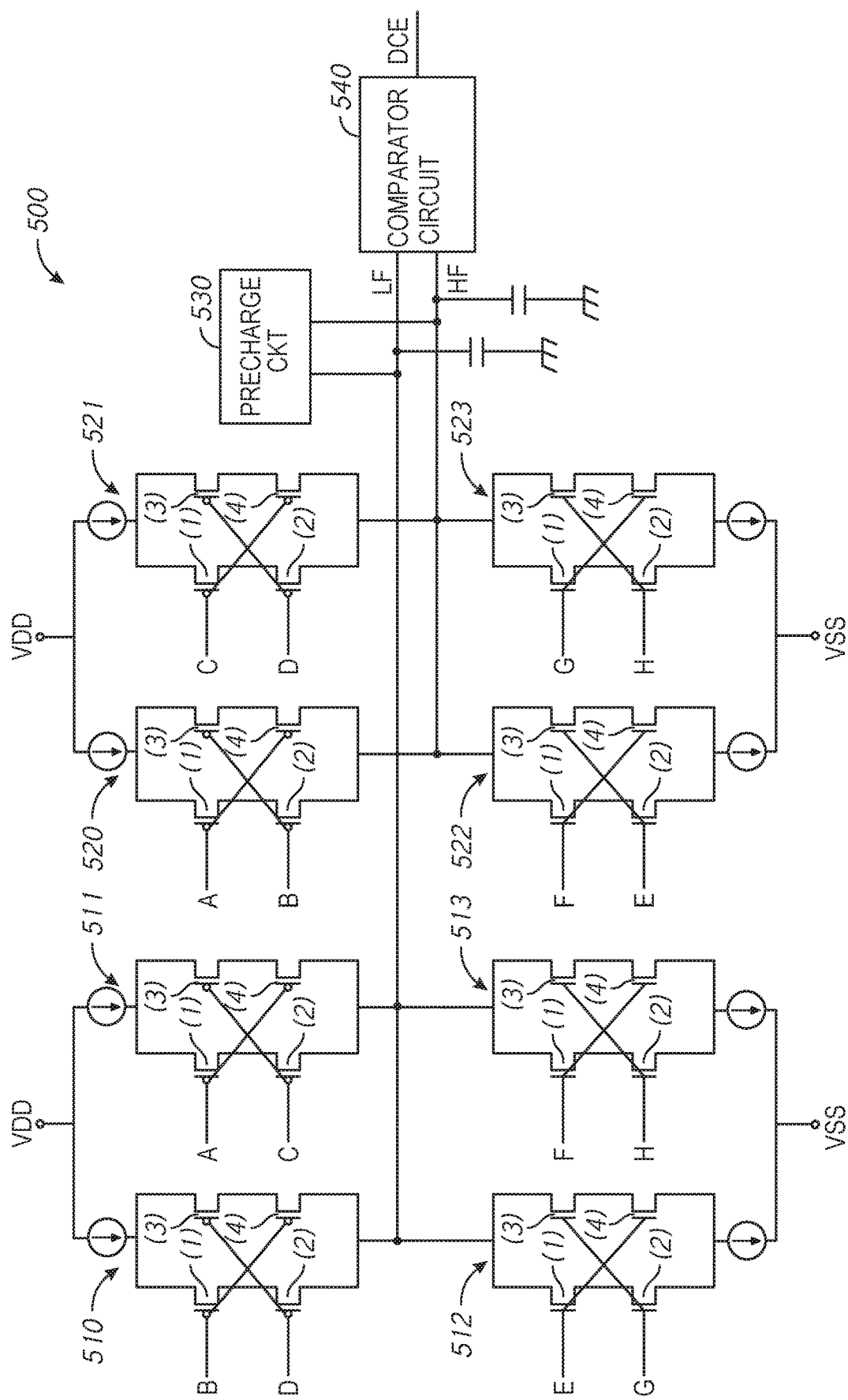
FIG. 5 illustrates a duty cycle detection circuit in accordance with an embodiment of the disclosure.

FIG. 5 illustrates duty cycle detection circuit 500 in accordance with an embodiment of the disclosure. The duty cycle detection circuit 500 may include pull-up circuits 510, 511, 520, and 521 and pull-down circuits 512, 513, 522, and 523 to provide the HF and LF signals. The internal clock generator 130 of FIG. 1, the duty cycle detector 240 of FIG. 2, and/or the duty cycle detection circuit 330 of FIG. 3 may include the duty detection circuit 500, in some examples.

The pull-up circuit 510 may couple the current source to the LF signal line when enabled. The pull-up circuit 510 may include transistors 510(1)-(4), with the pair of serially-coupled transistors 510(1) and 510(2) coupled in parallel with the pair of serially-coupled transistors 510(3) and 510(4). The B and D integration clock signals control the pull-up circuit 510. That is the B integration clock signal controls the transistors 510(1) and 510(4), and the D integration clock signal controls the transistors 510(2) and 510(3). The cross coupling of the B and D integration clock signals with the transistors 510(1)-(4) may provide a more reliable transition when enabling the pull-up circuit 510 as compared with a single transistor pair. However, the pull-up circuit 510 may be implemented with a single transistor pair (e.g., the pair of serially-coupled transistors 510(1) and 510(2) or the pair of serially-coupled transistors 510(3) and 510(4)) without departing from the scope of the disclosure.

The pull-up circuit 511 may couple the current source to the LF signal line when enabled. The pull-up circuit 511 may include transistors 511(1)-(4), with the pair of serially-coupled transistors 511(1) and 511(2) coupled in parallel with the pair of serially-coupled transistors 511(3) and 511(4). The A and C integration clock signals control the pull-up circuit 511. That is the A integration clock signal controls the transistors 511(1) and 511(4), and the C integration clock signal controls the transistors 511(2) and 511(3). The cross coupling of the A and C integration clock signals with the transistors 511(1)-(4) may provide a more reliable transition when enabling the pull-up circuit 511 as compared with a single transistor pair. However, the pull-up circuit 511 may be implemented with a single transistor pair (e.g., the pair of serially-coupled transistors 511(1) and 511(2) or the pair of serially-coupled transistors 511(3) and 511(4)) without departing from the scope of the disclosure.

The pull-down circuit 512 may couple the current sink to the LF signal line when enabled. The pull-down circuit 512 may include transistors 512(1)-(4), with the pair of serially-coupled transistors 512(1) and 512(2) coupled in parallel with the pair of serially-coupled transistors 512(3) and 512(4). The E and G integration clock signals control the pull-down circuit 512. That is the E integration clock signal controls the transistors 512(1) and 512(4), and the G integration clock signal controls the transistors 512(2) and 512(3). The cross coupling of the E and G integration clock signals with the transistors 512(1)-(4) may provide a more reliable transition when enabling the pull-down circuit 512 as compared with a single transistor pair. However, the pull-down circuit 512 may be implemented with a single transistor pair (e.g., the pair of serially-coupled transistors 512(1) and 512(2) or the pair of serially-coupled transistors 512(3) and 512(4)) without departing from the scope of the disclosure.

The pull-down circuit 513 may couple the current sink to the LF signal line when enabled. The pull-down circuit 513 may include transistors 513(1)-(4), with the pair of serially-coupled transistors 513(1) and 513(2) coupled in parallel with the pair of serially-coupled transistors 513(3) and 513(4). The F and H integration clock signals control the pull-down circuit 513. That is the F integration clock signal controls the transistors 513(1) and 513(4), and the H integration clock signal controls the transistors 513(2) and 513(3). The cross coupling of the F and H integration clock signals with the transistors 513(1)-(4) may provide a more reliable transition when enabling the pull-down circuit 513 as compared with a single transistor pair. However, the pull-down circuit 513 may be implemented with a single transistor pair (e.g., the pair of serially-coupled transistors 513(1) and 513(2) or the pair of serially-coupled transistors 513(3) and 513(4)) without departing from the scope of the disclosure.

The pull-up circuit 520 may couple the current source to the HF signal line when enabled. The pull-up circuit 520 may include transistors 520(1)-(4), with the pair of serially-coupled transistors 520(1) and 520(2) coupled in parallel with the pair of serially-coupled transistors 520(3) and 520(4). The A and B integration clock signals control the pull-up circuit 520. That is the A integration clock signal controls the transistors 520(1) and 520(4), and the B integration clock signal controls the transistors 520(2) and 520(3). The cross coupling of the A and B integration clock signals with the transistors 520(1)-(4) may provide a more reliable transition when enabling the pull-up circuit 520 as compared with a single transistor pair. However, the pull-up circuit 520 may be implemented with a single transistor pair (e.g., the pair of serially-coupled transistors 520(1) and 520(2) or the pair of serially-coupled transistors 520(3) and 520(4)) without departing from the scope of the disclosure.

The pull-up circuit 521 may couple the current source to the HF signal line when enabled. The pull-up circuit 521 may include transistors 521(1)-(4), with the pair of serially-coupled transistors 521(1) and 521(2) coupled in parallel with the pair of serially-coupled transistors 521(3) and 521(4). The C and D integration clock signals control the pull-up circuit 521. That is the C integration clock signal controls the transistors 521(1) and 521(4), and the D integration clock signal controls the transistors 521(2) and 521(3). The cross coupling of the C and D integration clock signals with the transistors 521(1)-(4) may provide a more reliable transition when enabling the pull-up circuit 521 as compared with a single transistor pair. However, the pull-up circuit 521 may be implemented with a single transistor pair (e.g., the pair of serially-coupled transistors 521(1) and 521(2) or the pair of serially-coupled transistors 521(3) and 521(4)) without departing from the scope of the disclosure.

The pull-down circuit 522 may couple the current sink to the HF signal line when enabled. The pull-down circuit 522 may include transistors 522(1)-(4), with the pair of serially-coupled transistors 522(1) and 522(2) coupled in parallel with the pair of serially-coupled transistors 522(3) and 522(4). The F and E integration clock signals control the pull-down circuit 522. That is the F integration clock signal controls the transistors 522(1) and 522(4), and the E integration clock signal controls the transistors 522(2) and 522(3). The cross coupling of the F and E integration clock signals with the transistors 522(1)-(4) may provide a more reliable transition when enabling the pull-down circuit 522 as compared with a single transistor pair. However, the pull-down circuit 522 may be implemented with a single transistor pair (e.g., the pair of serially-coupled transistors 522(1) and 522(2) or the pair of serially-coupled transistors 522(3) and 522(4)) without departing from the scope of the disclosure.

The pull-down circuit 523 may couple the current sink to the HF signal line when enabled. The pull-down circuit 523 may include transistors 523(1)-(4), with the pair of serially-coupled transistors 523(1) and 523(2) coupled in parallel with the pair of serially-coupled transistors 523(3) and 523(4). The G and H integration clock signals control the pull-down circuit 523. That is the G integration clock signal controls the transistors 523(1) and 523(4), and the H integration clock signal controls the transistors 523(2) and 523(3). The cross coupling of the G and H integration clock signals with the transistors 523(1)-(4) may provide a more reliable transition when enabling the pull-down circuit 523 as compared with a single transistor pair. However, the pull-down circuit 523 may be implemented with a single transistor pair (e.g., the pair of serially-coupled transistors 523(1) and 523(2) or the pair of serially-coupled transistors 523(3) and 523(4)) without departing from the scope of the disclosure.

The 530 may precharge the HF and LF signals lines to a predetermine voltage prior to a duty cycle error detection operation. In some examples, the precharge voltage may be equal to a voltage between the VDD and VSS voltages. The 540 may compare the voltages of the HF and LF signals to determine a duty cycle error. The duty cycle error may be based on a ratio of time the HF signal is high to an amount of time the LF signal is high. The 540 may provide the duty cycle error on the DCE signal. The 540 may be implemented in the comparison circuit 340 of FIG. 3.

Figure 6A:
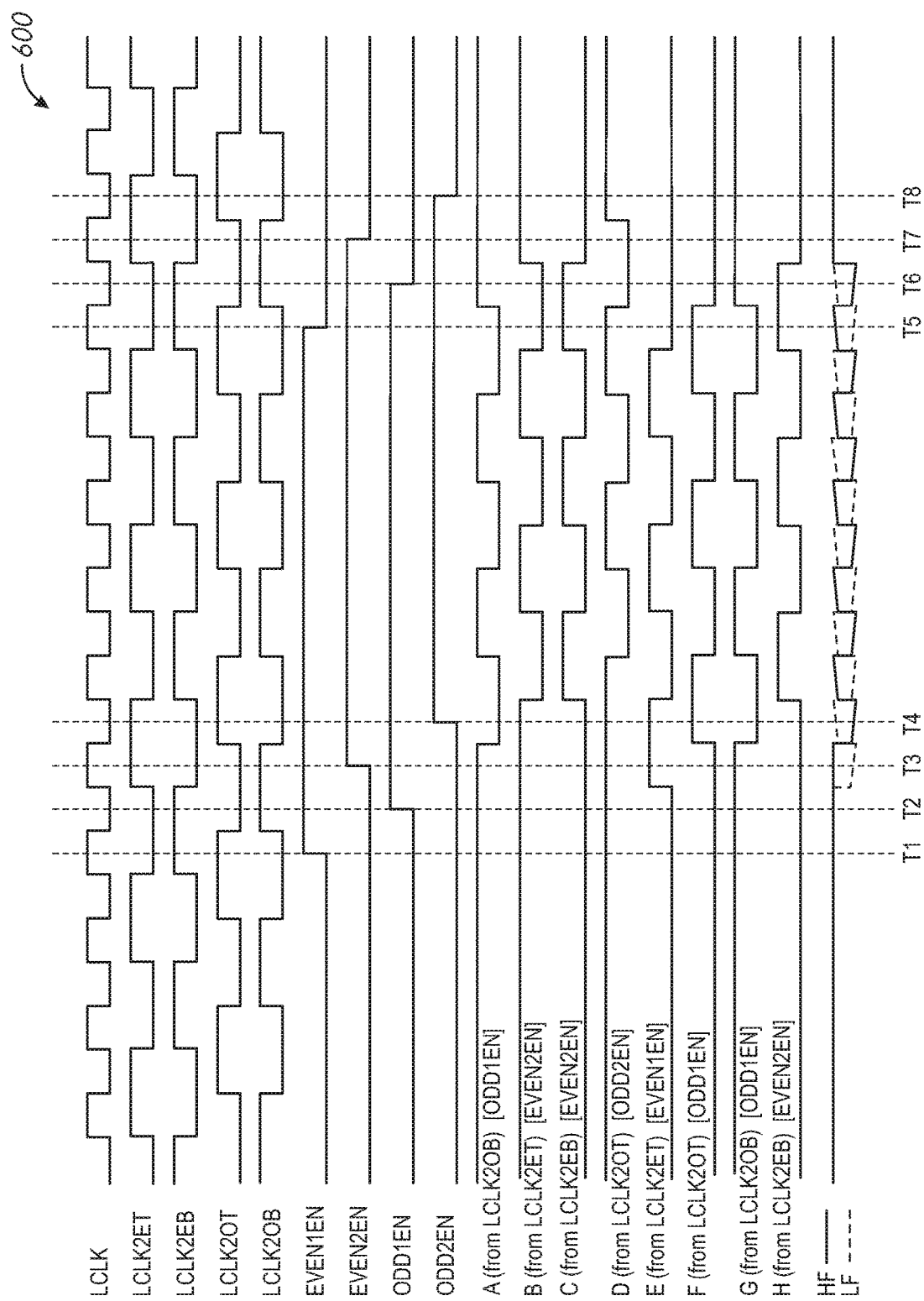
FIGS. 6A-6C are exemplary timing diagrams for determining a duty cycle error using divided clock signals according to an embodiment of the disclosure.
Figure 6B:
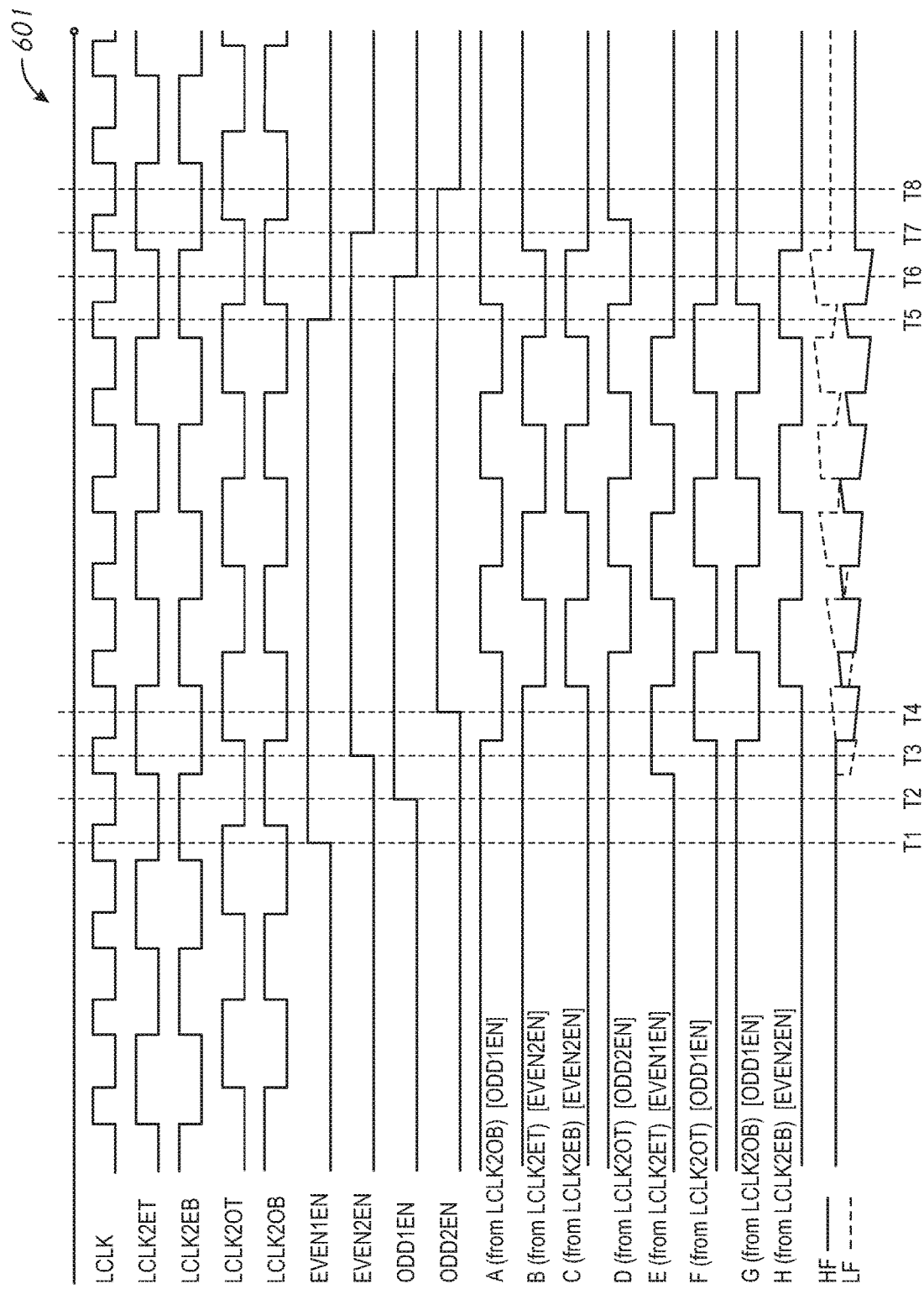
Figure 6C:
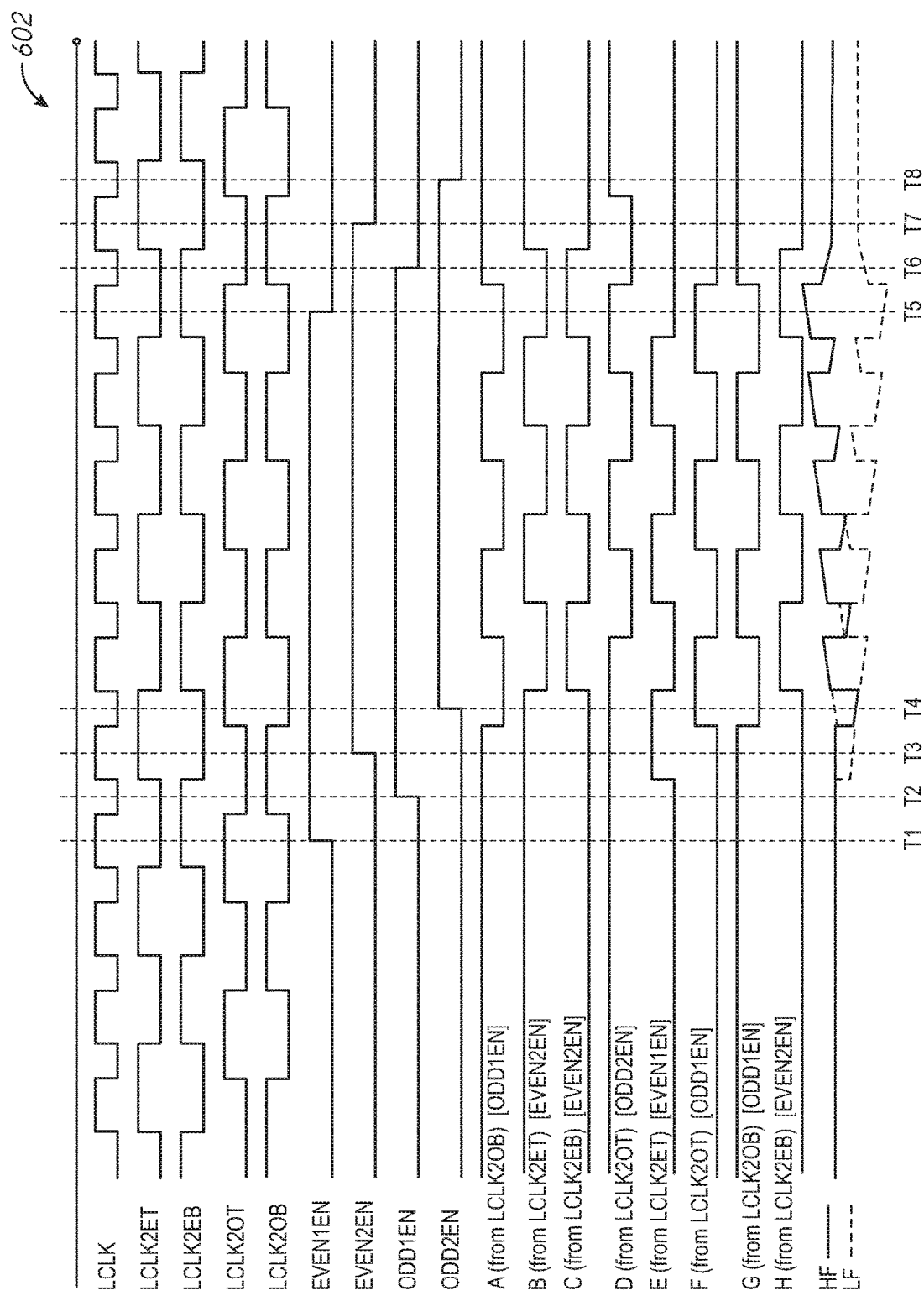

FIGS. 6A-6C are exemplary timing diagrams 600, 601, and 602 for determining a duty cycle error using divided clock signals according to an embodiment of the disclosure. The timing diagram 600 of FIG. 6A depicts the LCLK signal with a duty cycle of 50%, the timing diagram 601 of FIG. 6B depicts the LCLK signal with a duty cycle of 40%, and the timing diagram 602 of FIG. 6C depicts the LCLK signal with a duty cycle of 60%. The LCLK signal may correspond to the LCLK signal of FIGS. 1-4. The divided clock signals LCLK2ET, LCLK2EB, LCLK2OT, and LCLK2OB may correspond to the LCLK2ET, LCLK2EB, LCLK2OT, and LCLK2OB signals of FIGS. 3 and 4. The enable window signals EVEN1EN, EVEN2EN, ODD1EN, and ODD2EN may correspond to the enable window signals and the EVEN1EN, EVEN2EN, ODD1EN, and ODD2EN enable window signals of FIGS. 2-4. The A-H integration clock signals may correspond to the A-H integration clock signals of FIGS. 3-5. The HF and LF signals may correspond to the HF and LF signals of FIGS. 3 and 5. For clarity, the timing of the signals depicted in the timing diagrams 600, 601, and 602 assuming ideal conditions with no propagation or transition delays. It is understood that timing relationships between the signals may vary in non-ideal settings where propagation and transition delays exist. The times T1 and T5 correspond to transitions of the EVEN1EN signal in the timing diagrams 600, 601, and 602. The times T2 and T6 correspond to transitions of the ODD1EN signal in the timing diagrams 600, 601, and 602. The times T3 and T7 correspond to transitions of the EVEN2EN signal in the timing diagrams 600, 601, and 602. The times T4 and T8 correspond to transitions of the ODD2EN signal in the timing diagrams 600, 601, and 602.

At time T1, EVEN1EN signal transitions from a low logical value to a high logical value. In response to the transition of the EVEN1EN signal, the E integration clock signal begins toggling (e.g., based on the even logic circuit 404(2) of FIG. 4A). The T1 transition occurs at the same relative time for all three timing diagrams 600, 601, and 602.

At time T2, ODD1EN signal transitions from a low logical value to a high logical value. In response to the transition of the ODD1EN signal, the A, F, and G integration clock signals begin toggling (e.g., based on the odd logic circuits 406(0), 406(2), and 406(3) of FIG. 4B). The T2 transition occurs at different relative times for the timing diagrams 600, 601, and 602 because of the duty cycle error in the LCLK signal. In the timing diagram 601, the T2 ODDEN1 signal transition occurs earlier as compared with the timing diagram 600 because of the shorter initial portion of the LCLK signal. In the timing diagram 602, the T2 ODDEN1 signal transition occurs later as compared with the timing diagram 600 because of the longer initial portion of the LCLK signal.

At time T3, EVEN2EN signal transitions from a low logical value to a high logical value. In response to the transition of the EVEN2EN signal, the B, C, and H integration clock signals begin toggling (e.g., based on the even logic circuits 404(0), 404(1), and 404(3) of FIG. 4A). The T3 transition occurs at the same relative time for all three timing diagrams 600, 601, and 602.

At time T4, ODD2EN signal transitions from a low logical value to a high logical value. In response to the transition of the ODD2EN signal, the D integration clock signal begins toggling (e.g., based on the odd logic circuit 406(1) of FIG. 4B). The T4 transition occurs at different relative times for the timing diagrams 600, 601, and 602 because of the duty cycle error in the LCLK signal. In the timing diagram 601, the T4 ODDEN1 signal transition occurs earlier as compared with the timing diagram 600 because of the shorter initial portion of the LCLK signal. In the timing diagram 602, the T4 ODDEN2 signal transition occurs later as compared with the timing diagram 600 because of the longer initial portion of the LCLK signal.

At time T5, EVEN1EN signal transitions from a high logical value to a low logical value. In response to the transition of the EVEN1EN signal, the E integration clock signal stops toggling (e.g., based on the even logic circuit 404(2) of FIG. 4A). The T5 transition occurs at the same relative time for all three timing diagrams 600, 601, and 602.

At time T6, ODD1EN signal transitions from a high logical value to a low logical value. In response to the transition of the ODD1EN signal, the A, F, and G integration clock signals stop toggling (e.g., based on the odd logic circuits 406(0), 406(2), and 406(3) of FIG. 4B). The T6 transition occurs at different relative times for the timing diagrams 600, 601, and 602 because of the duty cycle error in the LCLK signal. In the timing diagram 601, the T6 ODDEN1 signal transition occurs earlier as compared with the timing diagram 600 because of the shorter initial portion of the LCLK signal. In the timing diagram 602, the T6 ODDEN1 signal transition occurs later as compared with the timing diagram 600 because of the longer initial portion of the LCLK signal.

At time T7, EVEN2EN signal transitions from a high logical value to a low logical value. In response to the transition of the EVEN2EN signal, the B, C, and H integration clock signals stop toggling (e.g., based on the even logic circuits 404(0), 404(1), and 404(3) of FIG. 4A). The T7 transition occurs at the same relative time for all three timing diagrams 600, 601, and 602.

At time T8, ODD2EN signal transitions from a high logical value to a low logical value. In response to the transition of the ODD2EN signal, the D integration clock signal stops toggling (e.g., based on the odd logic circuit 406(1) of FIG. 4B). The T8 transition occurs at different relative times for the timing diagrams 600, 601, and 602 because of the duty cycle error in the LCLK signal. In the timing diagram 601, the T8 ODDEN2 signal transition occurs earlier as compared with the timing diagram 600 because of the shorter initial portion of the LCLK signal. In the timing diagram 602, the T8 ODDEN2 signal transition occurs later as compared with the timing diagram 600 because of the longer initial portion of the LCLK signal.

As shown in the timing diagram 600, 601, and 602, when the enable window signals are set, the HF and LF signals begin toggling based on the A-H integration clock signals using the pull-up circuits 510, 511, 520, and 521 and pull-down circuits 512, 513, 522, and 523 of the duty cycle detection circuit 500 of FIG. 5. In the exemplary timing diagram 600, the LCLK signal has a 50%/ duty cycle, and the HF and LF signals indicate a 50% to 50% ratio, and therefore no duty cycle error. In the exemplary timing diagram 601, the LCLK signal has a 40% duty cycle, and the HF and LF signals diverge with the LF signal becoming greater than the HF signal, indicating a duty cycle error. In the exemplary timing diagram 602, the LCLK signal has a 600/% duty cycle, and the HF and LF signals diverge with the HF signal becoming greater than the LF signal, indicating a duty cycle error. It would be appreciated that the HF and LF signals would have different ratio if the LCLK signal had a duty cycle error.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   a duty cycle corrector configured to receive an input clock signal and to adjust a duty cycle of the input clock signal to provide a duty cycle corrected clock signal based, at least in part, on a voltage of a duty cycle error signal, wherein a first clock signal is generated based on the duty cycle corrected clock signal; and
   a clock divider configured to provide a second clock signal and a third clock signal based on the first clock signal, each of the second clock signal and the third clock signal having a longer clock cycle than the first clock signal and phases of the second clock signal and the third clock signal being shifted from each other;
   a duty cycle detection circuit including a first transistor and a second transistor coupled in series between a voltage terminal and an internal node, the first transistor being configured to receive the second clock signal at a gate thereof and the second transistor being configured to receive the third clock signal at a gate thereof, wherein, in response to the second and third clock signals, the first and second transistors are configured to selectively couple the voltage terminal to the first internal node, wherein the voltage of the duty cycle error signal is based on a voltage of the internal node.

2. The apparatus of claim 1, wherein the second clock signal and the third clock signal are equal in clock cycle to each other.

3. The apparatus of claim 1, wherein the duty cycle detection circuit further includes a precharge circuit configured to precharge the internal node with an additional voltage different from a voltage supplied with the voltage terminal.

4. The apparatus of claim 1, wherein the clock divider is further configured to produce a fourth clock signal and a fifth clock signal based on the first clock signal, each of the fourth clock signal and the fifth clock signal has a longer clock cycle than the first clock signal and phases of the fourth clock signal and fifth clock signal are shifted from each other; and,
   wherein the duty cycle detection circuit further includes a third transistor and a fourth transistor coupled in series between the voltage terminal and the internal node in parallel to the first transistor and the second transistor, the third transistor is configured to receive the third clock signal at a gate thereof and the fourth transistor is configured to receive the fourth clock signal at a gate thereof.

5. The apparatus of claim 4, wherein the fourth clock signal and the fifth clock signal are equal in clock cycle to each other.

6. The apparatus of claim 5, wherein phases of the second clock signal, the third clock signal, the fourth clock signal, and the fifth clock signal are shifted from one another.

7. The apparatus of claim 6, wherein the phase of the second clock signal is shifted by one quarter from the phase of the third clock signal, the phase of the third clock signal is shifted by one quarter from the phase of the fourth clock signal and the phase of the fourth clock signal is shifted by one quarter from the phase of the fifth clock signal.

8. An apparatus comprising:
 a duty cycle detector configured to receive a first clock signal and to generate a plurality of divided clock signals based on the first clock signal, wherein the plurality of divided clock signals have a longer period than the first clock signal, wherein, during a duty cycle detection operation, the duty cycle detector is further configured to determine a duty cycle error based on the plurality of divided clock signals, wherein the duty cycle detector includes a duty cycle detection circuit configured to receive clock signals based on the plurality of divided clock signals and to provide a high duty cycle signal and a low duty cycle signal, wherein the duty cycle error is based on values of the high duty cycle signal and the low duty cycle signal, wherein the duty cycle detection circuit comprises:
  a first pull-up circuit configured to couple the high duty cycle signal to a first voltage source in response to a first integration clock signal and a second clock signal generated based on the plurality of divided clock signals;
  a second pull-up circuit configured to couple the low duty cycle signal to the first voltage source in response to the first integration clock signal and a third integration clock signal generated based on the plurality of divided;
  a first pull-down circuit configured to couple the high duty cycle signal to a second voltage source in response to a fourth integration clock signal and a fifth integration clock signal generated based on the plurality of divided; and
  a second pull-down circuit configured to couple the low duty cycle signal to the second voltage source in response to the fourth integration clock signal and a sixth integration clock signal generated based on the plurality of divided; and
 a duty cycle corrector configured to adjust a duty cycle of an input clock signal based on the duty cycle error, wherein the first clock signal is generated based on the input clock signal.

9. The apparatus of claim 8, wherein the first pull-up circuit comprises:
 a first transistor and a second transistor coupled in series between the first voltage source and the high duty cycle signal, wherein the first transistor is controlled by the first integration clock signal and the second transistor is controlled by the second integration clock signal.

10. The apparatus of claim 9, wherein the first pull-up circuit further comprises:
 a third transistor and a fourth transistor coupled in series between the first voltage source and the high duty cycle signal, wherein the third transistor is controlled by the second integration clock signal and the fourth transistor is controlled by the first integration clock signal.

11. The apparatus of claim 9, wherein the first pull-down circuit comprises:
 a third transistor and a fourth transistor coupled in series between the second voltage source and the high duty cycle signal, wherein the third transistor is controlled by the fourth integration clock signal and the fourth transistor is controlled by the fifth integration clock signal.

12. A method comprising:
 providing a plurality of divided clock signals based on a first clock signal, wherein the plurality of divided clock signals have a longer period than a first clock signal;
 determining a duty cycle error of the first clock signal based on the plurality of divided clock signals, including:
  setting a high duty cycle signal value based on a set of integration clock signals generated from the plurality of divided clock signals;
  setting a low duty cycle signal value based on the set of integration clock signals; and
  determining a ratio of time the high duty cycle signal is set to time the low duty cycle signal to set, wherein the duty cycle error is based on the ratio; and
 adjusting a duty cycle of the first clock signal based on the duty cycle error.

13. The method of claim 12, wherein determining the duty cycle error of the first clock signal based on the plurality of divided clock signals during a duty cycle detection operation.

14. The method of claim 12, further comprising precharging the high duty cycle signal and the low duty cycle signal prior to setting the high duty cycle signal and setting the low duty cycle signal.

15. The method of claim 12, wherein setting the high duty cycle signal value based on the set of integration clock signals comprises controlling pull-up and pull-down circuits using the set of integration clock signals.

* * * * *